(12) United States Patent
Kawata

(10) Patent No.: US 6,403,268 B1
(45) Date of Patent: Jun. 11, 2002

(54) RETICLES FOR CHARGED-PARTICLE BEAM MICROLITHOGRAPHY

(75) Inventor: Shintaro Kawata, Saitama-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/542,026

(22) Filed: Apr. 3, 2000

(30) Foreign Application Priority Data

Apr. 7, 1999 (JP) .............................................. 11-099542

(51) Int. Cl.⁷ .............................. G03F 9/00; G03C 5/00
(52) U.S. Cl. ............................................ 430/5; 430/296
(58) Field of Search ............................ 430/5, 322, 296; 716/19, 21

(56) References Cited

U.S. PATENT DOCUMENTS 6,083,648 A * 7/2000 Nakasuji et al. ................ 430/5

OTHER PUBLICATIONS

Kawata et al., "Stencil Reticle Development for Electron Beam Projection System," *J. Vac. Sci. Technol.* 17:2864–2867 Dec. (1999).

Liddle, et al., "Error Budget Analysis of the SCALPEL® Mask for Sub–0.2 μm Lithography, " *J. Vac. Sci. Technol.* 13:2483–2487 Dec. (1995).

* cited by examiner

Primary Examiner—S. Rosasco
(74) Attorney, Agent, or Firm—Klarquist Sparkman LLP

(57) ABSTRACT

Reticles are provided for use in charged-particle-beam (CPB) microlithography, especially electron-beam microlithography. The reticle is configured as a segmented reticle of which the overall reticle size is reduced without compromising projection or stitching accuracy. A representative reticle includes a membrane that defines a pattern to be projection-transferred to a sensitive substrate, and support. struts that divide the membrane into multiple rectangular regions. Each rectangular region includes multiple subfields arranged longitudinally with intervening non-patterned regions. The width of the non-patterned regions is within the range of 1 μm to 50 μm.

10 Claims, 3 Drawing Sheets

RETICLES FOR CHARGED-PARTICLE BEAM MICROLITHOGRAPHY

FIELD OF THE INVENTION

The present invention pertains to microlithography performed using a charged particle beam such as an electron beam. More specifically, the invention pertains to reticles as used for such microlithography.

BACKGROUND OR THE INVENTION

In recent years the progressive miniaturization of semiconductor integrated circuit elements has led to current efforts to develop a practical projection-exposure system (microlithography system) that utilizes either an X-ray or a charged particle beam (e.g., electron beam or ion beam) as an energy beam. The reason is because optical microlithography (i.e., microlithography using light, especially ultraviolet light) has resolution limits that make it extremely difficult to impossible to resolve circuit elements as small as currently desired. Electron-beam microlithography offers prospects of achieving the currently desired pattern-element resolution (0.1 $\mu$m or less) because an electron beam can be focused to a diameter of a few nanometers.

Conventional electron-beam exposure systems "write" a pattern onto a wafer or other substrate one line at a time. Hence, the finer the pattern the more focused the electron beam must be. Also, the finer the pattern the longer the time required to draw the pattern. In fact, the time required to draw a pattern line-by-line is so long that the electron-beam-drawing technique cannot be used to expose wafers for mass production.

In view of the low "thoughput" (number of wafers processed per unit time) and hence low cost-efficiency of electron-beam drawing technology, considerable effort currently is being expended to develop a practical electron-beam projection-microlithography system in which an image of a pattern, defined by a reticle, is projected (rather than written) from a pattern-defining reticle onto the wafer. The projected image typically is "reduced" or "demagnified", by which is meant that the image is smaller (usually by an integer factor) than the corresponding pattern on the reticle. The image is projected onto the wafer using a projection lens.

To perform projection microlithography of a circuit pattern, a transfer mask ("reticle") is required upon which the circuit pattern is formed (i.e., the reticle "defines" the pattern). A first representative conventional reticle is a scattering-membrane reticle 31 as shown in FIG. 3(a). In the scattering-membrane reticle 31, the pattern is defined by a corresponding arrangement of "scattering bodies" 34 formed on a membrane 32. The scattering bodies 34 are respective portions of a layer of a material (e.g., heavy metal) that scatters incident electrons. The membrane 34 is relatively transmissive to the electron beam irradiating the upstream-facing surface of the reticle, whereas the scattering bodies 34 tend to scatter electrons incident on the reticle. A second representative conventional reticle is a scattering-stencil reticle 41 as shown in FIG. 3(b). In the scattering-stencil reticle 41, the pattern is defined by a corresponding arrangement of through-holes ("voids") 44 defined in a membrane 42. The membrane 42 is typically thicker than the membrane 34 in the scattering-membrane reticle 31 so as to exhibit substantial scattering of electrons in a beam incident on the upstream-facing surface of the reticle 41.

Due to the current impossibility of simultaneously exposing an entire reticle at one instant using a charged particle beam, conventional CPB-microlithography reticles typically are "divided" or "segmented" into multiple small regions ("subfields" or "exposure units"). In FIG. 3(c), each subfield on a scattering-membrane reticle 34 is denoted by the reference numeral 32a, and each subfield on a scattering-stencil reticle 41 is denoted by the reference numeral 42a. Each subfield 32a, 42a defines a respective portion of the overall pattern defined by the respective membrane 32, 42. A representative subfield 32a is shown in FIG. 3(a). The subfields are separated from one another by boundary regions 35 in which no pattern features are defined. Extending from each boundary region 35 is a support strut (item 33 in FIG. 3(a)) that provides physical support for the membrane 32. Reference is also made to FIG. 4 showing support struts 43 on a scattering-stencil reticle 41. The support struts 33, 43 form a criss-cross network on the respective reticle, wherein the subfields 32a, 42a are located between the support struts 33, 43.

In a conventional scattering-stencil reticle the membrane 42 typically is a silicon membrane about 2$\mu$m thick. As noted above, the membrane 42 defines the through-holes that are transmissive to the incident electron beam.

Conventionally, the area of the reticle that can be exposed at any instant by the incident electron beam is about 1 mm square. Hence, each subfield must define a respective portion of the overall pattern to be transferred to a particular region ("die") on the wafer, wherein a die corresponds to the area occupied by a "chip" as formed on the wafer.

As indicated in FIG. 3(c), pattern transfer is conventionally performed by illuminating the subfields 32a, 42a with the incident charged particle beam. The subfields 32a, 42a are typically exposed sequentially in a stepwise manner. As each subfield is illuminated for exposure, the corresponding portion of the pattern is demagnified and transferred to the "sensitive substrate" (wafer) 37 by a projection-optical system (not shown). The images of the subfields 32a, 42a are formed on the wafer 37 in respective locations in which the images are properly "stitched together" (contiguously arranged) with no intervening boundary regions.

In a conventional segmented reticle as described above, each support strut typically has a width of approximately 180 $\mu$m. The cumulative effect of having to dedicate a substantial portion of the reticle to non-pattern-defining struts is an excessively large reticle. Furthermore, during manufacture of such a reticle in which the struts are formed by etching, it is difficult to satisfactorily control the width of such support struts.

Moreover, the resulting large reticle must be mounted on and conveyed by a correspondingly large reticle stage. A suitably large reticle stage has a substantial mass that requires correspondingly large and robust stage-actuating mechanisms for moving the reticle as required for exposure.

One conventional approach for reducing the size of a segmented reticle is to arrange groups of subfields into rows, wherein each row of subfields is separated from other rows by support struts. Thus, each row contains multiple subfields situated side-by-side. (Such a reticle is regarded as having a "slot" configuration.) In order to scan a row of subfields, an electron beam is deflected in a lateral sweeping manner.

The positional accuracy of such scanning desirably is 0.5 $\mu$m or less. Unfortunately, maintaining such positional accuracy is not possible from the perspective of achieving adequate digital-to-analog (DAC) conversion of energizing signals routed to the respective deflectors in the electron-optical system. Also, the variation in positional accuracy of the electron beam is not uniform in conventional practice, resulting in double-exposed portions or non-exposed portions of the pattern as projected onto the wafer. These problems are manifest as "stitching" errors of the pattern as projected onto the wafer. Also, the continuously scanning electron beam must be rigorously controlled during exposure so as to achieve accurate stitching and to compensate for variations in pattern-element density and shape configurations from one subfield to the next. That is, the electron-optical system must be controlled in a manner allowing continuous high-speed processing. However, achieving such control is conventionally extremely problematic.

SUMMARY OF THE INVENTION

In view of the shortcomings of the prior art as summarized above, an object of the invention is to provide, inter alia, reticles for charged-particle-beam (CPB) microlithography that achieve the desired level of stitching accuracy while minimizing the overall size of the reticle.

As a result of thorough research, the inventor has discovered the optimal width of a non-patterned region located between subfields in a row of subfields in a slot reticle. A representative embodiment of such a reticle comprises a reticle membrane that defines a pattern to be projection-transferred from the reticle to a sensitive substrate. The reticle also comprises support struts configured to divide the membrane into multiple rectangular regions each defining a respective portion of the pattern. Each rectangular region comprises a longitudinal array of respective subfields (usually square in shape) each defining a respective portion of the pattern. Each subfield in a rectangular region is separated from adjacent subfields in the rectangular region by intervening non-patterned regions each having a width of 1 $\mu$m to 50 $\mu$m.

The subject reticle can be a scattering-membrane reticle or a scattering-stencil reticle. The non-patterned regions desirably are defined in a layer (e.g, 50 nm thick) of heavy metal such as gold, platinum, or tungsten.

According to another aspect of the invention, methods are provided for performing CPB microlithography. In a representative embodiment of such a method, a reticle is provided such as summarized above. The reticle is illuminated and projected as summarized above onto a sensitive substrate.

The foregoing and additional features and advantages of the invention will be more readily understood from the following detailed description, which proceeds with reference to the accompanying drawings.

BRIEF DESCRIPTION OF THE DRAWINGS

FIG. 3($b$) is an elevational sectional view of a portion of a conventional scattering-stencil reticle.

FIG. 3($c$) is a schematic oblique view showing certain conventional aspects of exposure of a pattern from a reticle to a sensitive substrate using a charged particle beam.

DETAILED DESCRIPTION

Figure 1:
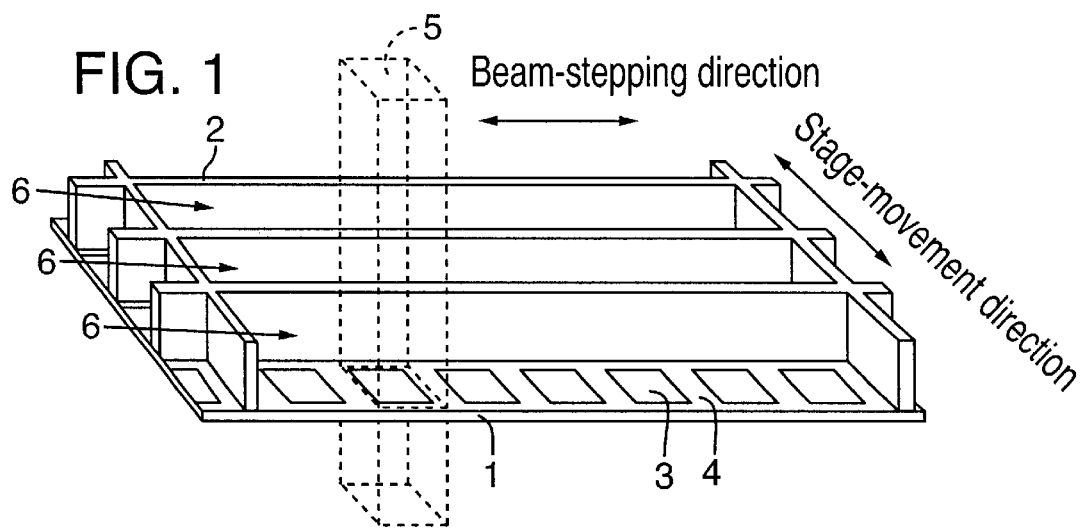
FIG. 1 is an oblique view of certain aspects of a reticle according to the invention.

FIG. 1 depicts a representative embodiment of a reticle, according to the invention, for microlithography using an electron beam (as a representative charged particle beam). The reticle comprises a membrane 1 that defines a pattern to be transferred to a sensitive substrate (not shown, but understood to be located downstream of the reticle). The reticle also comprises support struts 2 that divide the membrane 1 into multiple rectangular regions 6 each comprising multiple subfields 3. The constituent subfields 3 are linearly arranged within the rectangular regions 6. Within each rectangular region 6, the subfields are separated from each other by non-patterned regions 4. The width of each non-patterned region desirably is 1 $\mu$m to 50 $\mu$m.

The range of width (1 $\mu$m to 50 $\mu$m) of the non-patterned regions is derived from the achievable positioning accuracy of the charged particle beam necessary to prevent the beam from striking adjacent subfields. Variations in beam positioning can arise, for example, when an incident electron beam (having a uniform distribution of beam-current-density) is irradiated onto various subfields having different pattern-element sizes or pattern-element densities.

The non-patterned regions 4 situated between the subfields 3 and the support struts 2 extending in the longitudinal direction are configured by taking into account the amount of movement of the reticle stage, the achievable reticle-stage velocity, and the exposure time.

The non-patterned regions 4 can be defined by respective regions of a layer of a heavy metal (for example, gold, platinum, or tungsten).

An exemplary thickness of such a layer is 50 nm. Alternatively, the non-patterned regions can be scattering portions of the membrane 1.

The respective features defined in the subfields 3 can be defined as corresponding through-holes defined in the membrane 1 (to form a scattering-stencil reticle), or as corresponding regions of scattering bodies on a membrane (to form a scattering-membrane reticle). In a scattering-membrane reticle, the heavy-metal layer that defines the non-patterned regions 4 can also define the scattering bodies in the subfields 3.

Figure 2:
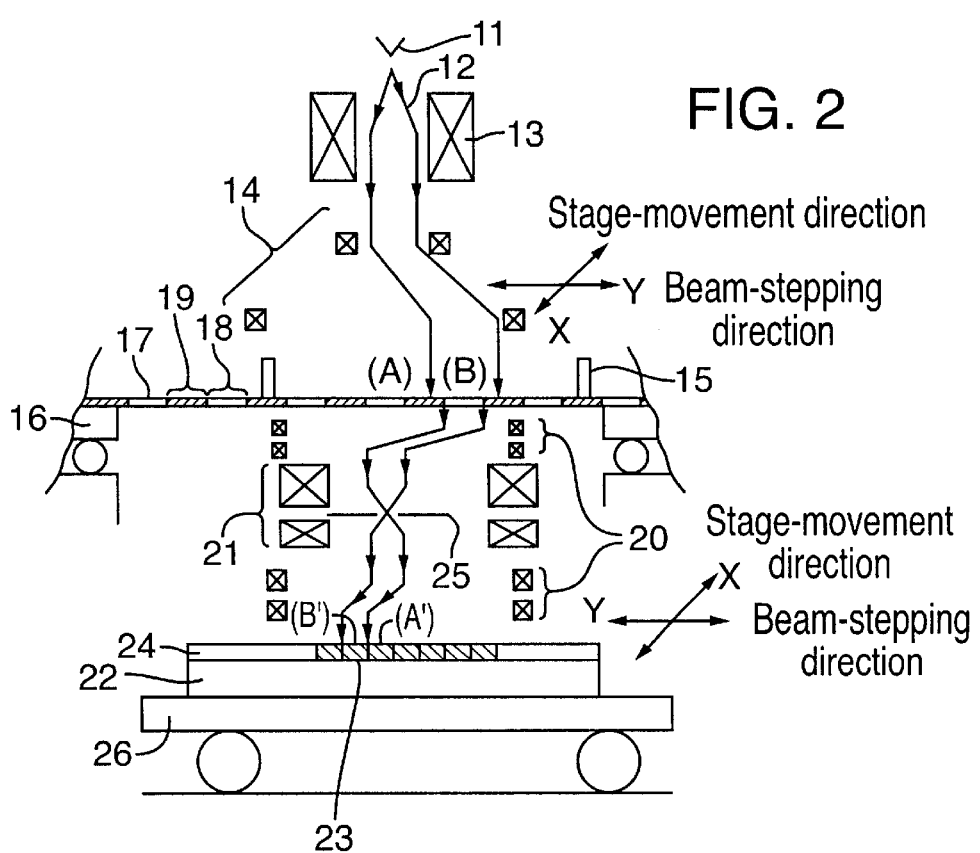
FIG. 2 is a schematic elevational view of a reticle according to the invention as loaded onto a reticle stage of a CPB microlithography apparatus.
Figure 3A:
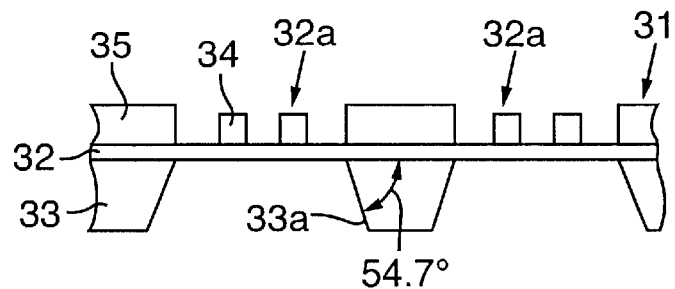
FIG. 3($a$) is an elevational view of a portion of a conventional scattering-membrane reticle.
Figure 3B:
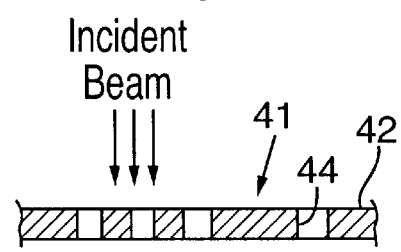
Figure 3C:
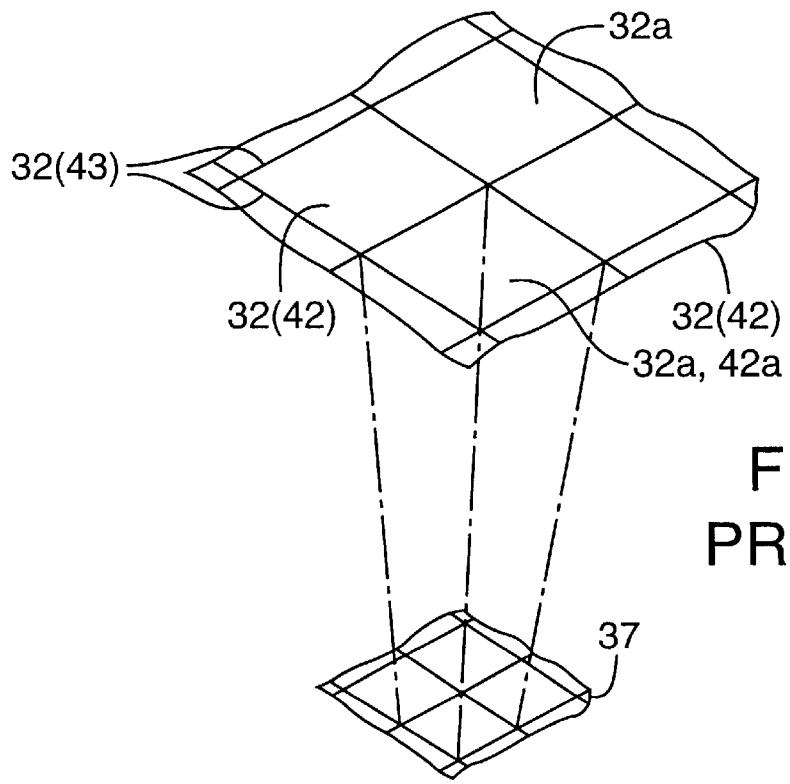
Figure 4:
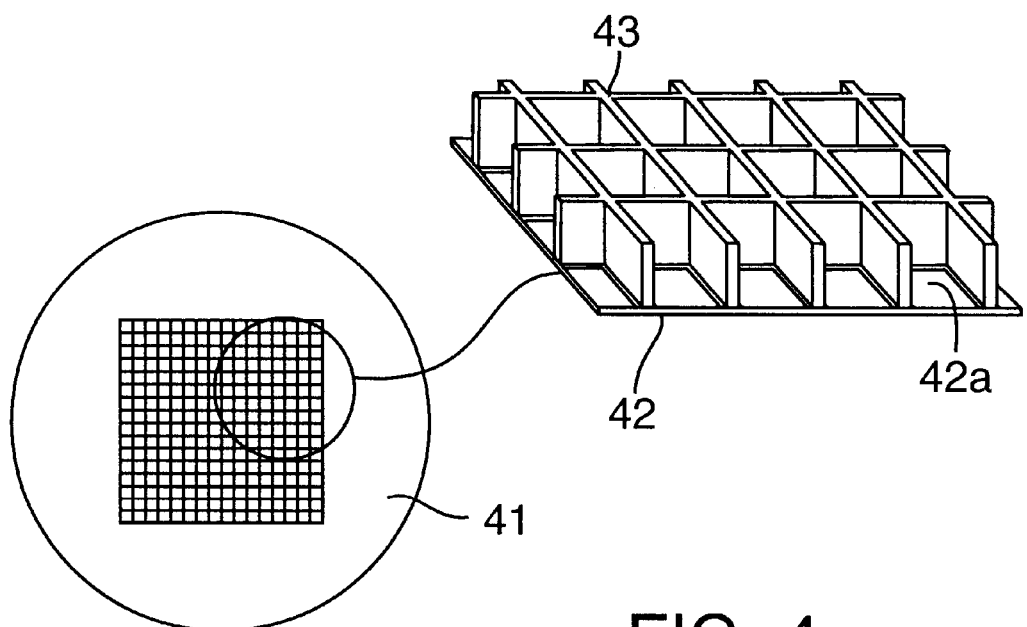
FIG. 4 is an oblique view of a conventional segmented reticle.

FIG. 2 shows a reticle according to the invention as mounted in a CPB microlithography apparatus (e.g., such an apparatus utilizing an electron beam as a representative charged particle beam). The FIG.-2 apparatus performs reductive (demagnifying) projection-exposure of the pattern, defined on the reticle, onto a substrate (wafer) 22. FIG. 2 shows an electron gun 11 that produces an electron beam 12 propagating downstream of the electron gun 11. The beam 12 passes through an illumination-optical system 13 and an illumination-deflector system 14 to a reticle 17. The reticle is mounted to a reticle stage 16. The reticle comprises support struts 15 and multiple subfields 18 separated from one another by non-patterned regions 19. After passing through a subfield 18, the beam passes through a projection-deflector system 20, and a projection-optical system 21 to the wafer 22. The upstream-facing surface of the wafer 22 is coated with a suitable resist 24 so as to be imprintable with an image 23 of the projected pattern. The projection-optical system includes a scattering aperture 25 and a wafer stage 26 on which the wafer is mounted for exposure.

By way of example, the beam-acceleration voltage is 100 KV, the demagnification ratio is 1/5, each subfield of the reticle measures 1 mm square, the beam current as incident on the wafer 22 is approximately 10 $\mu$A/subfield, and the sensitivity of the resist coated onto the wafer 22 is 10 $\mu$C/cm$^2$. Further by way of example, for a 20-mm square chip on the wafer 24, the patterned region of the reticle is approximately 120×125 mm. The size of a rectangular region 6 on the reticle is 1.1×27.5 mm, sufficient to accommodate a row of 25 subfields. The width of each non-patterned region is 50 $\mu$m.

The exemplary values of the parameters noted above are determined by factors such as the distance of movement of the reticle stage during exposure of each subfield, the respective positioning accuracy of the reticle stage and of the electron-optical system, and the reticle-fabrication accuracy.

The pattern elements defined in the respective subfields 18 of the reticle are transferred by a combination of stage scanning and electron-beam scanning. More specifically, the reticle stage 16 and wafer stage 26 are scanningly moved in the indicated X-direction in the figure. Meanwhile, the electron beam 12 is deflected in the indicated Y-direction in the figure. To expose each subfield 18 in a step-wise manner, the electron beam 12 passing through the illumination-optical system 13 is deflected by the deflector system 14; the beam then passes through the projection-optical system 21 while being deflected by the projection-deflector system 20. Meanwhile, the reticle stage 16 and wafer stage 26 are moved continuously.

The projection-optical system 21 and projection-deflector system perform transfer of each subfield image to the respective region on the wafer 22 as relative positional relationships of the reticle stage 16 and wafer stage 26 are maintained.

By way of example, an exposure of a subfield 18 requires approximately 0.4 msec. Meanwhile, the reticle stage 16 is continuously moving at 100 mm/sec. Consequently, during exposure of a subfield, the reticle stage 16 moves 0.02 mm. Due to the presence of non-patterned regions 19 (which are not exposed) between subfields 18, it is unnecessary to deflect the electron beam to follow the movement of the reticle stage during exposure.

The electron beam 12 illuminating the reticle 17 desirably has a dimension that exceeds the corresponding dimension of a subfield only by the amount of movement of the reticle stage during exposure of a subfield.

The electron beam 12 irradiated from the electron gun 11 is collimated by the illumination-optical system 13 for irradiation of the reticle 17. Selection of the particular subfield 1 8 on the reticle 17 that is illuminated by the electron beam 12 at any particular instant is performed by appropriately deflecting the beam using the illumination-deflector system 14.

As a result of projection of the respective pattern elements from the subfields 18 of the reticle 17 to the wafer 22, the pattern elements are imprinted in the resist 24 by the projection-optical system 21.

Selection of the particular region on the wafer 22 that is imprinted with an image of a respective subfield at any particular instant is performed by appropriately deflecting the beam using the projection-deflector system 20.

Exposure of the reticle pattern onto the wafer 22 is performed in a manner by which the non-patterned regions 19 on the reticle 17 are not exposed. Consequently, the images of the subfields 18 are stitched together on the wafer 22. For example, subfields A and B, which are adjoined via a non-patterned region 19 on the reticle 17, are consecutively transferred as the respective exposure "subfields" A' and B' on the resist 24 on the wafer 22.

In addition, as described above, any portions of the electron beam illuminated onto the non-patterned regions 19 of the reticle are scattered. The scattered electrons are blocked by the scattering aperture 25. As a result, electrons scattered by the non-patterned regions 19 do not participate in image formation on the wafer 22.

As explained above, a CPB microlithography reticle according to the invention permits further reduction of the reticle size, compared to conventional reticles, without compromising exposure or stitching accuracy.

Whereas the invention has been described in connection with a representative embodiment, it will be understood that the invention is not limited to that embodiment. On the contrary, the invention is intended to encompass all alternatives, modifications, and equivalents as may be included within the spirit and scope of the invention as defined by the appended claims.

What is claimed is:

1. A reticle for use in charged-particle-beam (CPB) microlithography, comprising:

a reticle membrane that defines a pattern to be projection-transferred from the reticle to a sensitive substrate;

support struts configured to divide the membrane into multiple rectangular regions each defining a respective portion of the pattern; and each rectangular region comprising a longitudinal array of respective subfields each defining a respective portion of the pattern, each subfield in a rectangular region being separated from adjacent subfields in the rectangular region by intervening non-patterned regions each having a width of 1 $\mu$m to 50 $\mu$m.

2. The reticle of claim 1, wherein each subfield is square.

3. The reticle of claim 2, wherein each subfield measures 1 mm square on the reticle.

4. The reticle of claim 1, that is a scattering-membrane reticle.

5. The reticle of claim 1, that is a scattering-stencil reticle.

6. The reticle of claim 1, wherein the non-patterned regions are defined in a layer of heavy metal selected from the group consisting of gold, platinum, and tungsten.

7. The reticle of claim 6, wherein the layer of heavy metal is 50 nm thick.

8. A reticle for use in charged-particle-beam (CPB) microlithography, comprising:

a reticle membrane that defines a pattern to be projectiontransferred from the reticle to a sensitive substrate;

the reticle membrane being divided into multiple rectangular regions each defining a respective portion of the pattern; and each rectangular region comprising a longitudinal array of respective subfields each defining a respective portion of the pattern, each subfield in a rectangular region being separated from adjacent subfields in the rectangular region by intervening non-patterned regions each having a width of 1 $\mu$m to 50 $\mu$m.

9. A method for performing CPB microlithography, comprising:

(a) providing a reticle as recited in claim 1, the reticle defining a pattern;

(b) illuminating the reticle with a charged particle beam; and (c) projecting the charged particle beam, passing through the reticle, onto a sensitive substrate.

10. The method of claim 9, wherein the charged particle beam is an electron beam.

* * * * *

UNITED STATES PATENT AND TRADEMARK OFFICE
CERTIFICATE OF CORRECTION

PATENT NO. : 6,403,268 B1 Page 1 of 1
DATED : June 11, 2002
INVENTOR(S) : Shintaro Kawata It is certified that error appears in the above-identified patent and that said Letters Patent is hereby corrected as shown below:

Title page,
Item [57], ABSTRACT,
Lines 7-8, "support. struts" should be -- support struts --.

Column 5,
Line 45, "1 8" should be -- 18 --.

Column 6,
Line 46, "projectiontransferred" should be -- projection transferred --.

Signed and Sealed this

Fourteenth Day of October, 2003

JAMES E. ROGAN
*Director of the United States Patent and Trademark Office*